(12) United States Patent
Fifield

(10) Patent No.: US 10,615,797 B2
(45) Date of Patent: *Apr. 7, 2020

(54) HIGH SPEED LEVEL TRANSLATOR

(71) Applicant: INTERNATIONAL BUSINESS MACHINES CORPORATION, Armonk, NY (US)

(72) Inventor: John A. Fifield, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/250,364

(22) Filed: Jan. 17, 2019

(65) Prior Publication Data
US 2019/0149153 A1 May 16, 2019

Related U.S. Application Data

(63) Continuation of application No. 15/783,044, filed on Oct. 13, 2017, now Pat. No. 10,224,932, which is a continuation of application No. 15/244,829, filed on Aug. 23, 2016, now Pat. No. 9,871,523, which is a continuation of application No. 14/463,136, filed on Aug. 19, 2014, now Pat. No. 9,503,090.

(51) Int. Cl.
*H03L 5/00* (2006.01)
*H03K 19/0185* (2006.01)
*H03K 19/017* (2006.01)
*H03K 19/0944* (2006.01)

(52) U.S. Cl.
CPC . *H03K 19/01855* (2013.01); *H03K 19/01742* (2013.01); *H03K 19/0944* (2013.01)

(58) Field of Classification Search
CPC ....... H03K 19/01855; H03K 19/01742; H03K 19/0944
USPC .......................................... 327/333
See application file for complete search history.

(56) References Cited

U.S. PATENT DOCUMENTS

| | | |
|---|---|---|
| 4,476,403 A | 10/1984 | Allen |
| 4,563,594 A | 1/1986 | Koyama |
| 4,996,451 A | 2/1991 | Chiriatii et al. |
| 5,034,623 A | 7/1991 | McAdams |
| 5,534,804 A | 7/1996 | Woo |
| 5,969,542 A | 10/1999 | Maley et al. |
| 6,198,318 B1 | 3/2001 | Bhaskaran et al. |
| 6,377,086 B1 | 4/2002 | Bays et al. |
| 6,836,148 B2 | 12/2004 | Pullen et al. |
| 6,870,407 B2 | 3/2005 | Lundberg |

(Continued)

OTHER PUBLICATIONS

List of IBM Patents or Patent Applications Treated as Related 1 page.

*Primary Examiner* — Dinh T Le
(74) *Attorney, Agent, or Firm* — Steven Meyers; Andrew M. Calderon; Roberts Mlotkowski Safran Cole & Calderon, P.C.

(57) ABSTRACT

A high speed VPP level translator circuit using thin-oxide field effect transistors (FETs) and methods of use are disclosed. The level translator includes a resistor divider and a one-shot circuit in parallel with the resistor divider. The one-shot circuit conducts to assist a transition from a first state to a second state, and is non-conducting during the transition from the second state to the first state.

11 Claims, 2 Drawing Sheets

(56) References Cited

U.S. PATENT DOCUMENTS

| | | | |
|---|---|---|---|
| 6,885,238 B2 * | 4/2005 | Sher | G11C 5/145 |
| | | | 327/525 |
| 7,365,587 B2 | 4/2008 | Ramaraju et al. | |
| 7,417,476 B1 | 8/2008 | Hung | |
| 7,593,203 B2 | 9/2009 | Dudnikov, Jr. et al. | |
| 7,619,459 B2 | 11/2009 | Ryan | |
| 8,030,964 B1 | 10/2011 | Shih et al. | |
| 8,149,017 B2 | 4/2012 | Knierim | |
| 8,593,203 B2 | 11/2013 | Shankar et al. | |
| 8,680,908 B2 | 3/2014 | Chen et al. | |
| 8,797,072 B2 | 8/2014 | Shrivastava et al. | |
| 9,503,090 B2 * | 11/2016 | Fifield | H03K 19/01742 |
| 9,871,523 B2 * | 1/2018 | Fifield | H03K 19/01742 |
| 2008/0258798 A1 | 10/2008 | Huang et al. | |
| 2016/0056822 A1 | 2/2016 | Fifield | |
| 2016/0365858 A1 | 12/2016 | Fifield | |
| 2018/0041213 A1 | 2/2018 | Fifield | |

* cited by examiner

HIGH SPEED LEVEL TRANSLATOR

FIELD OF THE INVENTION

The invention relates to level translator circuits and, more particularly, to high speed VPP level translator circuits using thin-oxide field effect transistors (FETs) and methods of use.

BACKGROUND

In eDram technologies, a ground-to-Vdd level clock signal is translated to a ground-to-Vpp level signal with level translators designed to work between 3-voltage levels. Some eDram technologies, though, need a 4-level Vpp level translator to switch a thin-oxide PFET gate to a safe 'on-voltage' from an 'off-state' of Vpp.

To improve low voltage operability and timing alignment to Vdd-level clocks, it is desirable to use only thin-oxide, low voltage FETs with a voltage stress limit of Vdd, where Vdd MAX is 1.05V, Vpp is 1.6V and the safe on-voltage is Vpp-Vdd_MAX. In such technologies, the level translator is needed to translate a ground-to-Vdd clock to Vpp2-to-Vpp levels of about 0.55V and 1.60V, respectively.

In a thin-oxide level translator, a static latch powered by Vpp is configured with high-voltage capacitors to receive Vdd level logic signals. In this solution, static, un-gated feedback latches may not switch due to FET manufacturing tolerances in Vt and other devices. Accordingly, un-gated feedback latch designs have been replaced with more predictable gated-feedback latches. Also, in such thin-oxide level translators, capacitors of sufficient size capable of providing reliable switching current need to be large. Large capacitance on the latch nodes, though, limits the operating speed of the static latch. Accordingly, a trade-off between switching robustness and operating speed has to be made.

SUMMARY

In an aspect of the invention, a level translator comprises a resistor divider. The level translator further comprises a one-shot circuit in parallel with the resistor divider, and which conducts to assist a transition from a first state to a second state, and is non-conducting during the transition from the second state to the first state.

In an aspect of the invention, a level translator comprises a resistor divider comprising a first resistor and a second resistor, in series. The level translator further comprises a one-shot circuit comprising a first transistor and a second transistor, in series, and in parallel with the resistor divider. An inverter chain provides control to the first transistor and the second transistor.

In an aspect of the invention, a method comprises controlling transistors of a pull-up stack such that the pull-up stack conducts to assist a transition from a first state to a second state, and is non-conducting during the transition from the second state to the first state.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to level translator circuits and, more particularly, to a high speed VPP level translator using thin-oxide field effect transistors (FETs) and methods of use. More specifically, the present invention provides a four (4)-level voltage translation circuit using a resistor circuit to establish a low level equal to a low-level power supply. The 4-level voltage translation circuit further comprises a one-shot circuit which conducts to assist in a transition from a first state to a second state, and is non-conducting during the transition from the second state to the first state. In this way, the 4-level voltage translation circuit can perform as a high speed level translator operating between 4-voltage levels with which ground/Vdd level signals can be translated to VPP2/VPP levels using only thin-oxide FET devices.

In embodiments, the 4-level voltage translation circuit switches a thin-oxide PFET gate to a safe "on-voltage" from an "off-state" of VPP. To improve low voltage operability and timing alignment to Vdd-level clocks, the 4-level voltage translation circuit uses only thin-oxide, low voltage FETs with a voltage stress limit of Vdd. In preferred embodiments, Vdd MAX is 1.05V, VPP is 1.6V and the safe on-voltage is Vdd_MAX. Moreover, the 4-level voltage translation circuit can translate a ground (GND) to Vdd clock to VPP2 to VPP levels of about 0.55V and 1.60V respectively. The 4-level voltage translation circuit also employs feedback to improve the switching performance in the direction serviced by a resistor pull up.

The 4-level translator of the present invention can be manufactured in a number of ways using a number of different tools. In general, though, the methodologies and tools are used to form structures with dimensions in the micrometer and nanometer scale. The methodologies, i.e., technologies, employed to manufacture the level translator of the present invention have been adopted from integrated circuit (IC) technology. For example, the structures of the present invention are built on wafers and are realized in films of material patterned by photolithographic processes on the top of a wafer. In particular, the fabrication of the level translator of the present invention uses basic building blocks, including: (i) deposition of thin films of material on a substrate, (ii) applying a patterned mask on top of the films by photolithographic imaging, and (iii) etching the films selectively to the mask.

Figure 1:
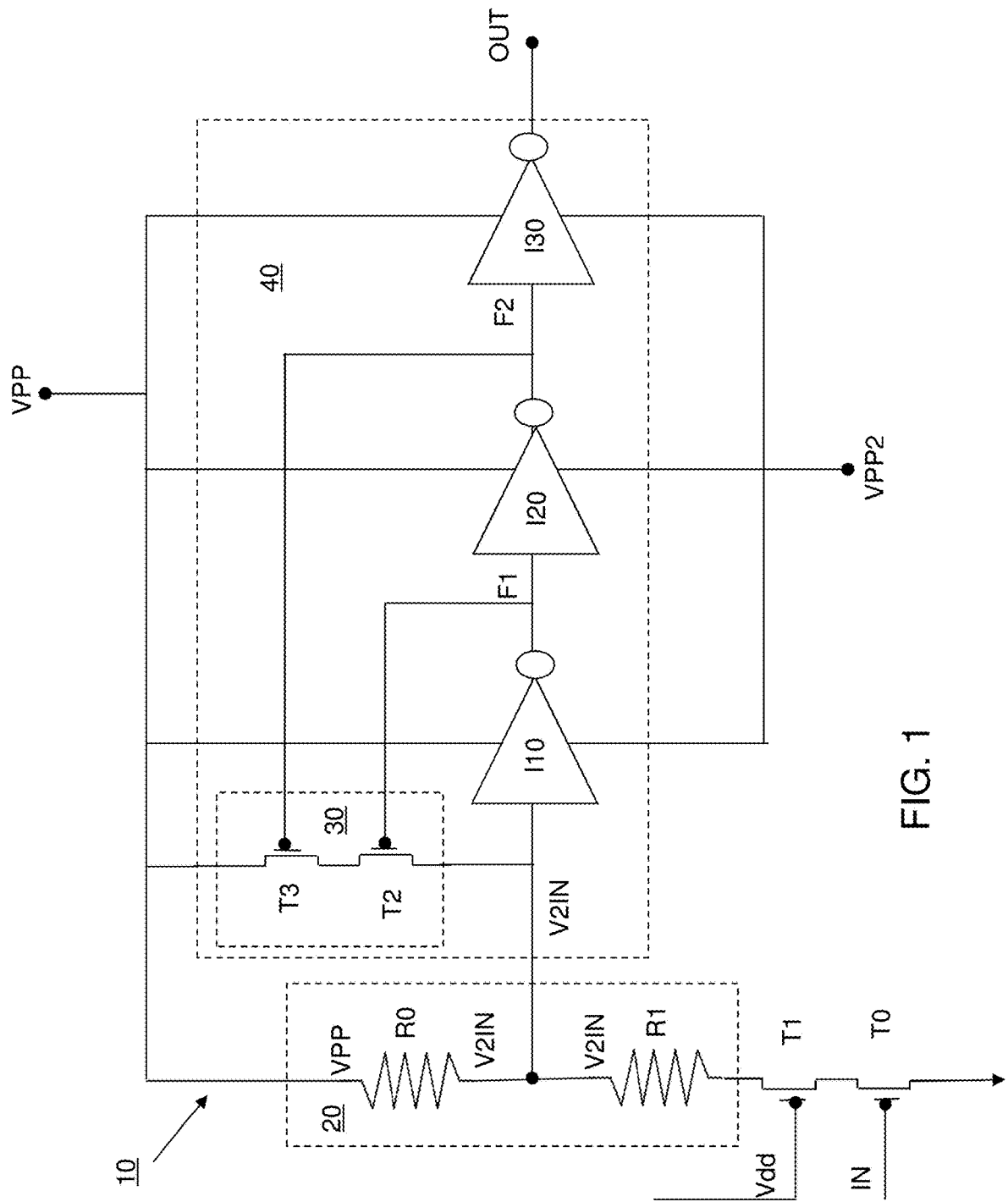
FIG. 1 shows an exemplary circuit diagram in accordance with aspects of the present invention.

FIG. 1 shows an exemplary circuit diagram in accordance with aspects of the present invention. More specifically, FIG. 1 shows a 4-level voltage translation circuit 10 using only thin-oxide FETs. In embodiments, the 4-level voltage translation circuit 10 includes a resistor divider 20 which comprises a first resistor R0 and a second resistor R1, in series. The resistor divider 20 can be enabled, e.g., turned on, by transistors T0 and T1. The transistors T1 and T0 can be NMOS transistors. In embodiments, transistor T1 is a series stack device to limit the stress across transistor T0 to Vdd. Input, IN, is provided at the gate of the transistor T0.

In embodiments, the resistive values of resistors R0 and R1 are chosen to output voltage signal V2IN of approximately VPP2 when transistor T0 receives a Vdd level logic input signal (IN). When the resistor divider 20 is disabled, voltage signal V2IN is approximately VPP. In such a configuration, in an enabled state, V2IN can be provided at the output of the second resistor R1 (and fed to inverter I10), and VPP is connected to the first resistor R0.

In the embodiment shown in FIG. 1, the first resistor R0 has a larger resistive value than the second resistor R1 (R0>R1); although, the present invention contemplates an embodiment in which the second resistor R1 is greater than the first resistor R0 (R1>R0). By way of example, with regard to the embodiment shown in FIG. 1, the first resistor R0 can be, e.g., 20K-ohms and the second resistor R1 can be, e.g., 10.3K-ohms; although other resistive values are also contemplated by the present invention depending on the specific application.

Still referring to FIG. 1, in embodiments, a pull-up stack 30 is provided in parallel with the resistor divider 20 and more specifically the first resistor R0. The pull-up stack 30 comprises two transistors, T2 and T3, in series, which allows conduction from VPP to V2IN. As should be understood by those of skill in the art, VPP is a high supply input signal. In embodiments, the transistors T2 and T3 can be PFETs; although the present invention also contemplates the use of NFETs. By way of example, the transistors T2 and T3 can be NFETs and arranged in parallel with the second resistor R1 when the value of the second resistor R1 is greater than the first resistor RO (R1>R0). In this embodiment, V2IN would be provided between the second resistor R1 and GND.

In embodiments, the pull-up stack 30 is enabled during the transition of low-to-high switching which increases the switching speed. The pull-up stack 30, on the other hand, is disabled when low-to-high switching is complete such that a subsequent high-to low transition is unimpeded by the pull-up stack. In this way, the pull-up stack 30 and more specifically, a one-shot circuit 40 conducts to assist the transition from a first state to a second state, and non-conducting during the transition from the second state to the first state. In embodiments, timing to Vdd level clocks is retained.

In embodiments, the one-shot circuit 40 includes the pull-up stack 30, e.g., transistors T2 and T3, in addition to inverter chain comprising inverters I10-I30. The inverters I10-I30 can be thin-oxide inverter devices connected in series to establish a pull-up gate signal and its complement. In embodiments, the inverters I10-I30 are provided in series, e.g., an inverter chain, having outputs which control the gates of series connected FETs, e.g., transistors T2 and T3, which provide a conduction path between one of the output levels to the output of the resistor divider 20. In the one-shot circuit 40, the inverter I30 is a buffer, for example, and VPP2 is a low supply level voltage for inverters I10-I30. By implementing the one-shot circuit 40, it s now possible to conduct to assist the transition from a first state to a second state, and non-conducting during the transition from the second state to the first state. Also, in embodiments, timing to Vdd level clocks is retained.

In operation, the one-shot circuit 40 receives input signal V2IN, which can be propagated to nodes F1 and F2. In this operational state, the pull-up stack 30 is turned on resulting in a brief pulse of current running through the transistors T2 and T3 which, in turn, pulls up the voltage V2IN (e.g., input signal of V2IN). Accordingly, transistors T2 and T3 form a series connected pull-up stack to improve the rise time of node V2IN. In further operation, when a Vdd level logic signal (IN) is received at the gate of transistor T0, node V2IN is pulled to approximately VPP2 which switches inverter I10 and drives node F1 toward VPP. Node F2 was initially at VPP level so the pull-up stack 30 is off, e.g., transistor T3 was off. On the other hand, when node F1 switches to VPP, node F2 falls to VPP2 and the gate of transistor T3 is in an on-state in preparation for the next cycle. Clean logic levels are available at node F2 or on buffered node OUT.

When the Vdd logic level is switched from its high-state to an off-state (i.e. 0-volts) node V2IN is initially pulled up through resistor R0. In embodiments, pull-up to VPP is slower than the pull-down to VPP2 when resistor R0 is larger than resistor R1. When node V2IN reaches the switch point of inverter I10, node F1 falls and turns on the gate of transistor T2. The gate of transistor T3 is already on, so conduction through pull-up stack transistor T2 and T3 flows to node V2IN and speeds up its rise to VPP. When inverter I20 switches, node F2 rises to VPP which shuts off the pull-up helper stack to prevent slow-down of the fall of node V2IN in the next cycle. Advantageously, the pull-up stack 30 is switched off before the input node is reversed to prevent a slow down on the pull-down time. In the exemplary design, an RMS current of 26.4 μa of VPP current is consumed with a 50-50 duty-factor input signal.

More specifically, in the static state, e.g., non-conducting state of the pull-up stack 30 (e.g., off state), the inverter I10 receives a low input signal. The low input signal is inverted to a high signal, VPP, which is received at node F1. The high signal, VPP, places the transistor T2 in a non-conducting state (e.g., off state); however, the high signal, VPP, is also inverted to a low signal by inverter I20. The low signal will be received at node F2 which, in turn, will place the transistor T3 in a conducting state (e.g., on state). In this way, no current will be provided to the series of inverters I10-I30, from the pull-up stack 30. When the input IN is dropped to GND, though, the transistor T2 will be placed in a conducting state (e.g., on state) and the transistor T3 will initially be in a conducting state and will transition to a non-conducting state (e.g., off state). In this way, the pull-up stack 30 will effectively only conduct during a transition state and, hence, quickly brings V2IN high (e.g., as transistor T2 was precharged at its source by transistor T3 when in the conducting state). Advantageously, the pull-up stack 30 and more specifically the one-shot circuit 40 will only temporarily conduct and, hence, will not compete with the pull-down on voltage signal V2IN when the circuit is switched to logic high. That is, the circuit of the present invention will not impede the transition of V2IN from a high level to a low level (e.g., pull-down).

Figure 2:
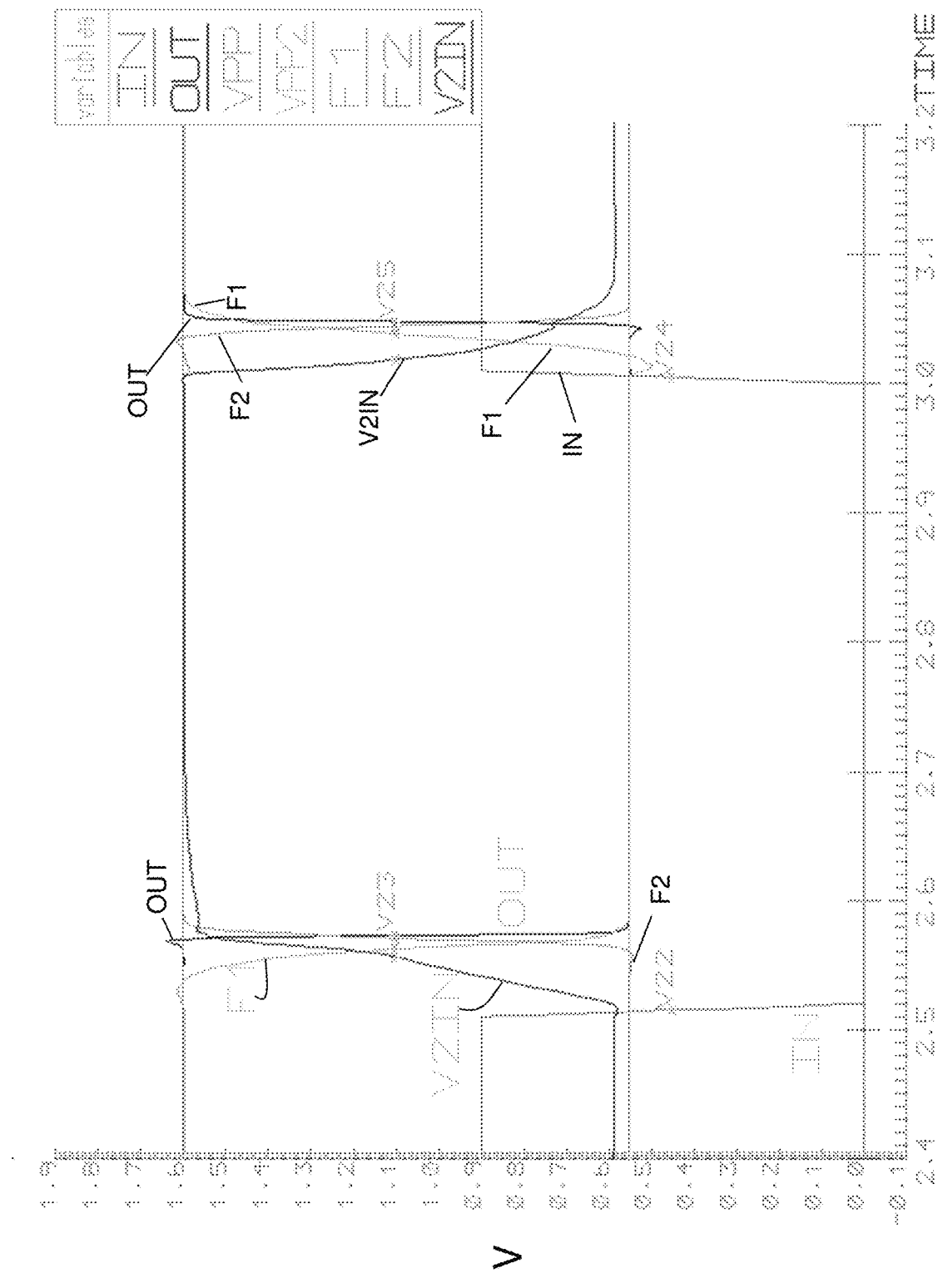
FIG. 2 shows a timing diagram of an exemplary circuit, in accordance with aspects of the present invention.

FIG. 2 shows a timing diagram of an exemplary circuit, in accordance with aspects of the present invention. More specifically, FIG. 2 shows a timing diagram of an exemplary circuit in a nominal process at 125° C. As shown in this figure, the circuit of the present invention has a delay of 67 ps. As shown in FIG. 2, the x-axis is representative of time and the y-axis is representative of voltage. At time 0, VIN is at about 0.9V and V2IN is about 0.55 V. In the static state, e.g., non-conducting state, the input voltage is high and V2IN is low, F1 is high, F2 is low (about 0.55 V) and the output is high. In contrast, when the input voltage is low, the resistor divider turns off and V2IN rises. Accordingly, the resistor divider 20 is switched on/off to provide an output at VPP2 level and a VPP level, and the one-shot circuit 40 provides a conduction path between one of the output levels to the output of the resistor divider 20.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A level translator comprising:
   a one-shot circuit coupled to a controllable resistor divider connected between an input voltage (VPP) and ground;
   transistors coupled in parallel with a first resistor of the controllable resistor divider; and
   an inverter chain coupled to the controllable resistor divider to receive a voltage level VPP2 and having outputs to control gates of the transistors,
   wherein the level translator is a 4-level translator circuit which translates the input voltage VPP to output levels VPP2/VPP at the outputs, a voltage stress applied to the transistors is limited to a level of a logic input signal inputted to control the controllable resistor divider, and the VPP2 and the VPP are supplied by the controllable resistor divider to supply inverters of the inverter chain.

2. The level translator of claim 1, wherein the one-shot circuit translates from a low voltage to a high voltage using the transistors which are arranged in parallel with the first resistor of the controllable resistor divider.

3. The level translator of claim 2, wherein the inverter chain has outputs controlling gates of the transistors to generate an output signal oscillating between the supply voltage VPP2 and the supply voltage VPP to provide a conduction path between an output level of the first resistor for operation between voltage levels with which the level and the ground can be translated to the voltage VPP2 and the supply voltage VPP.

4. The level translator of claim 1, wherein the transistors are provided with a feedback loop to improve switching performance in a direction serviced by a resistor pull up.

5. The level translator of claim 1, wherein the controllable resistor divider comprises the first resistor and a second resistor, in series, which is enabled by a first transistor and a second transistor.

6. The level translator of claim 5, wherein resistive values of the first resistor and second resistor are chosen to output a voltage signal V2IN of approximately the voltage VPP2 when the first transistor receives a Vdd level logic input signal, and when the controllable resistor divider is disabled, the voltage signal V2IN is approximately the voltage VPP.

7. The level translator of claim 6, wherein:
   the one-shot circuit comprises a pull-up stack comprising a third transistor and a fourth transistor, in series, which allows conduction from the voltage VPP to the voltage signal V2IN;
   the pull-up stack is enabled during transition of low-to-high switching; and
   the pull-up stack is disabled when the low-to-high switching is complete.

8. The level translator of claim 7, wherein the inverter chain comprises inverters connected in series.

9. The level translator of claim 8, wherein the inverters are connected in series and establish a pull-up gate signal and its complement to the third transistor and the fourth transistor.

10. A level translator, comprising:
    a controllable resistor divider connected between an input voltage (VPP) and ground, the controllable resistor divider comprising a first resistor and a second resistor;
    a one-shot circuit coupled to the controllable resistor divider and comprising a pull-up stack of transistors coupled in parallel with the first resistor of resistor divider; and
    an inverter chain coupled to the controllable resistor divider to receive a voltage level VPP2 and having outputs controlling to control gates of the transistors,
    wherein the level translator is a 4-level translator circuit which translates the input voltage VPP to output levels VPP2/VPP at the outputs, a voltage stress applied to the transistors is limited to a level of a logic input signal inputted to control the controllable resistor divider, and the VPP2 and the VPP are supplied by the controllable resistor divider to supply inverters of the inverter chain.

11. A level translator comprising:
    a one-shot circuit coupled to a controllable resistor divider and comprising connected between an input voltage (VPP) and ground;
    transistors coupled in parallel with a first resistor of the controllable resistor divider; and
    an inverter chain coupled to the controllable resistor divider to receive a voltage level VPP2 and having outputs to control gates of the transistors, wherein:
    the controllable resistor divider comprises the first resistor and a second resistor, in series, which is enabled by a first transistor and a second transistor,
    resistive values of the first resistor and second resistor are chosen to output a voltage signal V2IN of approximately VPP2 when the first transistor receives a Vdd level logic input signal, and
    when the controllable resistor divider is disabled, the voltage signal V2IN is approximately VPP, and
    wherein the level translator is a 4-level translator circuit which translates the input voltage VPP to output levels VPP2/VPP at the outputs, a voltage stress applied to the first transistor and the second transistor is limited to a level of a logic input signal inputted to control the controllable resistor divider, and the VPP2 and the VPP are supplied by the controllable resistor divider to supply inverters of the inverter chain.

* * * * *